United States Patent [19]
Kawai et al.

[11] Patent Number: 5,187,565
[45] Date of Patent: Feb. 16, 1993

[54] LIQUID SEALED SEMICONDUCTOR DEVICE AND METHOD OF ASSEMBLING THE SAME

[75] Inventors: Masataka Kawai, Kawanishi; Seiji Takemura, Itami, both of Japan

[73] Assignee: Mitsubishi Denki Kabushiki Kaisha, Tokyo, Japan

[21] Appl. No.: 717,069

[22] Filed: Jun. 18, 1991

[30] Foreign Application Priority Data

Mar. 18, 1991 [JP] Japan .................. 3-51962

[51] Int. Cl.⁵ ..................... H01L 23/34; H01L 23/02
[52] U.S. Cl. ........................ 257/682; 257/787
[58] Field of Search .................. 357/82, 79, 72, 78; 361/414

[56] References Cited
U.S. PATENT DOCUMENTS

| | | | |
|---|---|---|---|
| 4,730,665 | 3/1988 | Cutchaur | 357/82 |
| 4,731,644 | 3/1988 | Neidig | 357/79 |
| 4,922,381 | 5/1990 | Longerich et al. | 361/414 |

FOREIGN PATENT DOCUMENTS

0128291 11/1978 Japan .
57-198649 12/1982 Japan .
62-221164 9/1987 Japan .
1-301175 12/1989 Japan .
1-302167 12/1989 Japan .
2-67965 3/1990 Japan .
2-251178 10/1990 Japan .

OTHER PUBLICATIONS

Electronic Design—Sep. 22, 1988; Tiny Accelerometer IC Reaches High Sensitivity; Richard Nass.

*Primary Examiner*—Eugene R. LaRoche
*Assistant Examiner*—Viet Q. Nguyen
*Attorney, Agent, or Firm*—Oblon, Spivak, McClelland, Maier & Neustadt

[57] ABSTRACT

A liquid sealed semiconductor device comprises a base, semiconductor elements which are mounted to the base, a leading pin passing through the base and protruding to the outside of a package, a cap which is jointed to the base and covers the semiconductor elements, liquid filling the package, a sponge provided within the package and an internal cap for fastening the sponge to the inner wall of the package.

The sponge absorbs the pressure change due to the expansion or the contraction of the internal liquid so as to prevent the liquid from leaking out of the package and to protect the package from being deformed. Furthermore, the internal cap eliminates the possibility that the sponge would drop down.

9 Claims, 8 Drawing Sheets

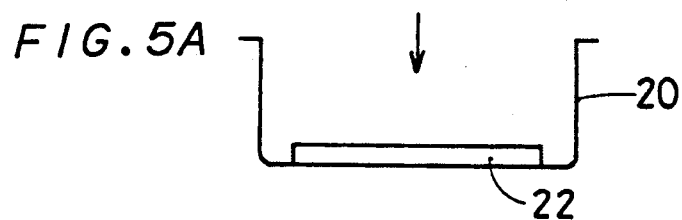
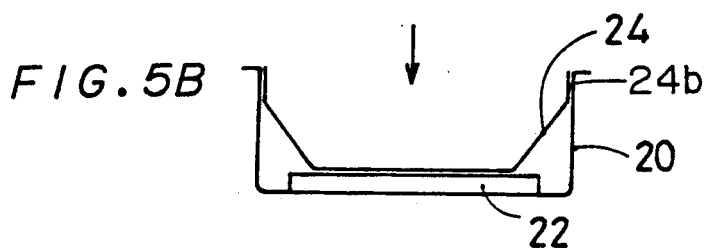
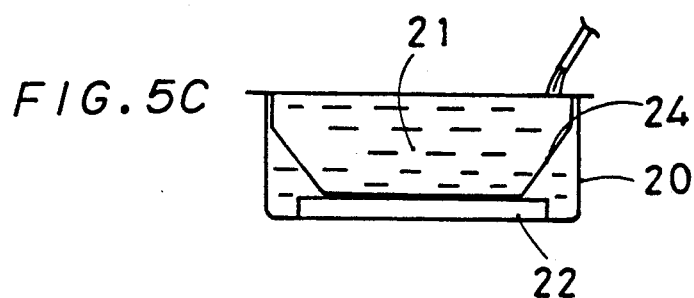
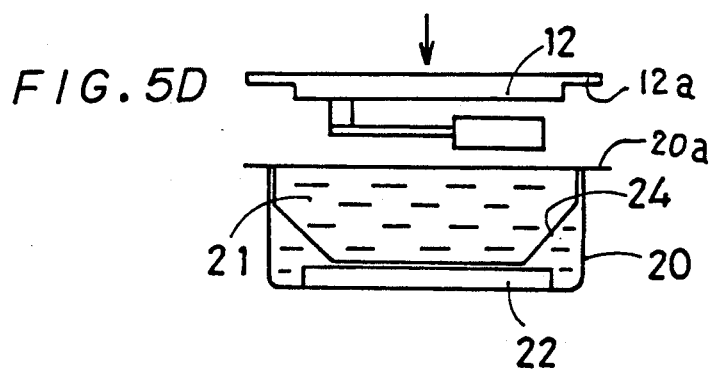
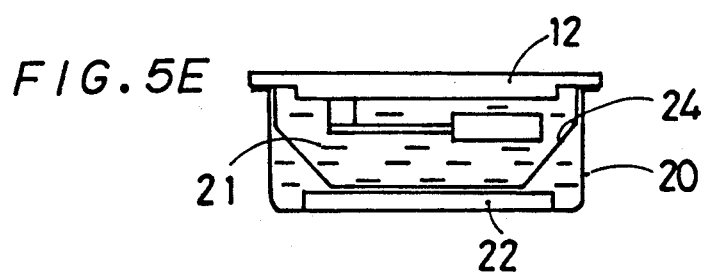

LIQUID SEALED SEMICONDUCTOR DEVICE AND METHOD OF ASSEMBLING THE SAME

BACKGROUND OF THE INVENTION

1. Field of the Invention

The present invention relates to a liquid sealed semiconductor device in which a semiconductor element, such as a semiconductor acceleration sensor, for example, and liquid are hermetically sealed within a package thereof, and it also relates to a method of assembling the same.

2. Description of the Prior Art

A semiconductor acceleration sensor is explained as an example of a semiconductor device in which a semiconductor element and liquid are hermetically sealed within a package thereof.

A sensing part of a semiconductor acceleration sensor usually comprises a cantilever. If the cantilever resonates, the sensing part is damaged or responds to an unnecessary frequency range. In order to avoid the resonance, damping liquid is employed as a high cut-off filter. This semiconductor acceleration sensor is assembled through the steps of installing the sensing part in a base, joining a cap to the base by screws to form a package injecting damping water into the package and hermetically sealing the package.

When the semiconductor acceleration sensor is applied to detecting acceleration of a motor vehicle or the like, the ambient temperature varies in the range of $-40°$ C. to $+120°$ C. When damping liquid expands or contracts within the temperature range, damping liquid leaks out of the package through the joining gap between the base and the cap.

A highly airtight package is required in order to prevent a leak of damping liquid under a rigorous operating condition. Even such a highly airtight package, however, can not be free from being influenced by changes in the internal pressure within the package due to the expansion or the contraction of the damping liquid. When the damping liquid expands, the internal pressure increases. As a result, the package is deformed and the capacity thereof increases. On the other hand, when the damping liquid contracts, the internal pressure decreases and there is a vacuum portion formed within the package. The deformation of the package due to the expansion or the contraction of the damping liquid has an adverse effect on the sensing part. The deformation of the package can be prevented by improving rigidity and pressure resistance of the package. Manufacturing cost for such a highly rigid and pressure-tight package, however, increases significantly. Furthermore, the pressure of the damping liquid rises significantly at high temperature. As a result, the operation of the sensing part is greatly affected and detecting accuracy is deteriorated.

A conventional semiconductor acceleration sensor shown in FIG. 8 has been produced in order to solve these problems.

FIG. 8 is a vertical sectional view shematically illustrating the conventional semiconductor acceleration sensor. A base 1 is made of a metal or the like and has a welding part 1a formed at the peripheral portion. A cap 2 is made of a metal or the like and has a welding part 2a formed at the peripheral portion. The base 1 and the cap 2 are jointed together to form a package.

The cap 2 has an injection hole 2b and an air hole 2c at the top face as well as a bulkhead 2d at the inner wall of the top face. A pedestal 3 is adhered to the base 1. A cantilever 4 has a fixed edge which is adhered onto the pedestal 3 and a free edge which is allowed to move free. The pedestal 3, together with the cantilever 4, forms a sensing part.

A detector 5 is formed on the cantilever 4. A semiconductor strain gauge is formed in the detector 5 by a thermal diffusion method or an ion-implantation method. The semiconductor strain gauge is electrically connected with resistive elements, for example, through a wire which is formed by an aluminum deposition, for example, to thereby organize a full-bridge circuit.

A weight 6 is mounted to the free edge of the cantilever 4. A leading pin 7 passes through the base 1 and protrudes to the outside of the package. Hard glass 8 fastens the leading pin 7 to the base 1 and seals the clearance between the leading pin 7 and a through hole of the base 1. A wire 9 made of gold or aluminum wirebonds the leading pin 7 and the detector 5. Silicon oil or the like is employed as the damping liquid 10 and is hermetically sealed within the package. A portion representing 20-30% of the whole capacity of the package does not contain the damping liquid so as to form an air layer 11. (The air layer 11 occupies the portion shown in FIG. 8 when the side A comes to the top.)

The process for sealing liquid and air within the package of the conventional semiconductor acceleration sensor will be described below. Before the sealing process is conducted, the pedestal 3 is adhered to the base 1, and the cantilever 4 is mounted to the pedestal 3. In the first step, the welding part 2a of the cap 2 is electric-resistance-welded to the welding part 1a of the base 1 so as to form the hermetically sealed package. Then, a certain amount of the damping liquid which corresponds to about 70-80% of the whole capacity of the package is injected into the package through the injection hole 2b. At the same time, the air within the package is discharged through the air hole 2c so that about 20-30% of the air is left within the package to thereby form the air layer 11.

Then the injection hole 2b and the air hole 2c are hermetically soldered so that the damping liquid 10 and the air layer 11 are hermetically sealed within the package.

The semiconductor acceleration sensor thus assembled is set so that the side A thereof comes to the top. Consequently, the air layer occupies the upper portion of the sensor. The sensor is mounted to a motor vehicle or the like with the side A always being a top face. When acceleration is applied to the free edge of the cantilever 4, resistance value of the semiconductor strain gauge changes so that unbalanced voltage occurs within the full-bridge circuit. The semiconductor acceleration sensor detects the acceleration on the basis of the value of the unbalanced voltage.

When the semiconductor acceleration sensor is mounted to a motor vehicle or the like, the ambient temperature changes in the range of $-40°$ C. to $+120°$ C. According to the temperature change, damping liquid expands or contracts. The expansion or the contraction, however, is absorbed by the air layer 11 remaining in the package. The increase or the decrease of the internal pressure within the package due to the expansion or the contraction of the damping liquid is thus absorbed by the air layer 11. Therefore, the damping liquid does not leak out of the package through the joining gap between the welding parts 1a and 2a, and the package can maintain a high airtightness. The bulkhead 2d provided at the inner wall of the package protects the cantilever 4 from being affected by waves of the damping liquid or air bubbles of the air layer which causes noise.

When the above-mentioned conventional semiconductor acceleration sensor is mounted, it is necessary that the side A always comes to the top, whereby the sensing part occupies a lower part of the package and the air layer 11 occupies an upper part thereof as shown in FIG. 8. Therefore, the conventional sensor needs to be mounted only in a confined direction. There is another problem with the conventional semiconductor acceleration sensor when it is mounted to a motor vehicle or the like. In some cases, as in the case where a motor vehicle to which the conventional sensor is installed leans towards one direction to a great degree, for example, some of the air in the air layer 1 may goes beyond the bulkhead 2d and enters in the sensing part which has been completely submerged in the damping liquid. In such cases, a damping effect is reduced or is extinguished by the air, and noise is liable to occur. There is another problem in the process of assembling the conventional semiconductor acceleration sensor. The process for assembling the conventional semiconductor acceleration sensor comprises three steps, i.e., a step of providing the bulkhead 2d at the inner wall of the cap 2, a step of forming the package by welding the base 1 and the cap 2, and a step of forming the air layer within the package and sealing the injection hole 2b and the air hole 2c. Such a complicated process causes a high manufacturing cost.

SUMMARY OF THE INVENTION

The present invention is directed to a liquid sealed semiconductor device comprising a semiconductor element, a base to which the semiconductor element is installed, a cap which is joined to the base so as to cover the semiconductor element, liquid for filling a package which is formed by joining the base and the cap, foam material provided in the package and a fastening member for fastening the foam material to the inner wall of the package.

The present invention is also directed to a method of assembling the liquid sealed semiconductor device, the method comprising steps of preparing the cap, installing the foam material to the inner wall of the cap by the fastening member, filling the cap with the liquid and installing the base provided with the semiconductor element to the cap.

According to the present invention, the liquid sealed semiconductor device comprises a foam material within the package. Since the foam material contains cells inside, it deforms to absorb the increase or the decrease in the pressure of the damping liquid within the package when the damping liquid expands or contracts due to the change in the ambient temperature. The foam material thus prevents a leak of the damping liquid out of the package as well as a deformation of the package.

Since the cells are sealed within the foam material and the package is filled with the liquid, the package can be installed to an apparatus to which the liquid sealed semiconductor device is to be applied in any direction relative to the apparatus.

Furthermore, there can be removed the possibility that the foam material would be dropped down onto the semiconductor element, since the foam material is fastened to the inner wall of the package by the fastening member.

According to the present invention, the method of assembling the liquid sealed semiconductor device does not require the step of sealing the injection hole and the air hole after liquid is injected into the package. Thus the assembling process can be completed through a smaller number of steps.

According to the present invention, as been described above, the liquid sealed semiconductor device comprises a package which is filled with a liquid and has a foam material therein. Such a structure can avoid the overexpansion of the internal pressure even under the condition in which the temperature frequently changes since the sponge material absorbs the pressure changes due to the expansion or the contraction of the liquid. Consequently, a leak of the liquid out of the package through a sealing part as well as the deformation of the package can be avoided. In addition, since the sponge is mechanically fastened to the inner wall of the package by a fastening member, the sponge does not move nor fall down by an influence of the internal liquid. Consequently, the operation of the semiconductor device can be smoothly conducted without being influenced by the sponge. Furthermore, the liquid sealed semiconductor device can be installed to an apparatus in any direction.

According to the present invention, the method of assembling a liquid sealed semiconductor device does not require the conventional complicated steps of sealing the injection hole and the air hole after injecting the liquid into the package through the injection hole. The conventional method further requires a precise flow controller for controlling the amount of the damping liquid since there is a need for leaving 20-30% of the whole capacity of the package as the air layer. According to the present invention, on the other hand, the package is simply filled with the liquid. Therefore, such a highly precise flow controller is not necessarily provided and the equippment cost can be reduced.

The present invention has been produced to solve the above-mentioned problems in the prior art, and therefore it is an object of the present invention to obtain a liquid sealed semiconductor device which can be installed to an apparatus in any direction, which can maintain a high airtightness under a rigorous operating condition, and which can be produced with a less manufacturing cost. The another object of the present invention is to obtain a method of assembling such a liquid sealed semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5A through 5E are explanatory views illustrating a preferred embodiment of a method of assembling the semiconductor acceleration sensor shown in FIG. 1;

DESCRIPTION OF THE PREFERRED EMBODIMENTS

Figure 3:
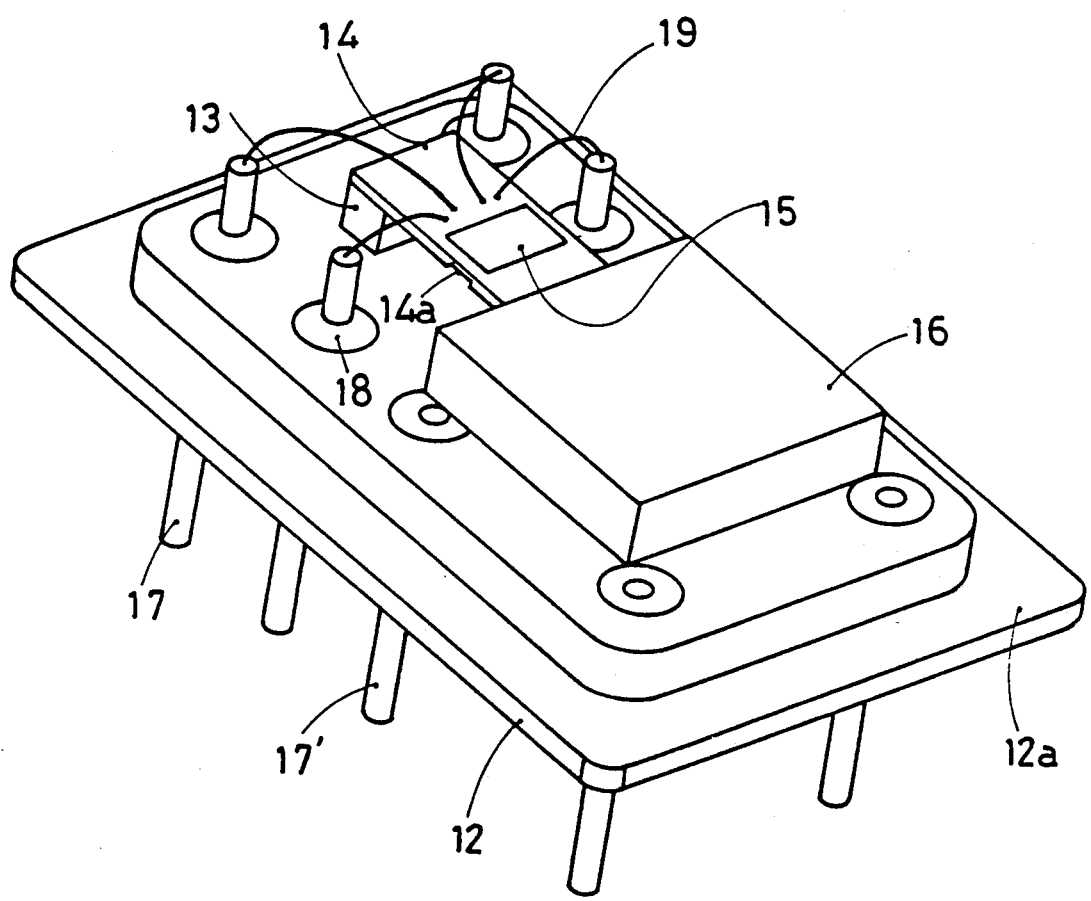
FIG. 3 is a diagonal view showing a base part of the semiconductor acceleration sensor shown in FIG. 1.

FIG. 3 illustrates a base part of a liquid sealed semiconductor device in accordance with a first preferred embodiment of the present invention. A semiconductor acceleration sensor is taken as an example of the liquid sealed semiconductor device.

Referring to FIG. 3, a base 12 is made of covar, 42 alloy, SPC or the like and has a welding part 12a at the peripheral portion.

A pedestal 13 made of silicon or the like is adhered onto the base 12 through an epoxy-family adhesive, a silicon-family adhesive, a brazing solder or the like.

A cantilever 14 is made of silicon or the like. One edge portion of the cantilever 14 is jointed to the pedestal 13 by an anode junction or through a glass which has a low melting point, while other edge portion being allowed to move free. In order to improve sensitivity of an acceleration detection in the vicinity of the fixed edge, a portion of the cantilever 14 is etched through an etching process to thereby form a thin portion 14a. A detector 15 is formed on the thin portion 14a.

Semiconductor strain gauge are formed in the detector 15 through a semiconductor processing steps. The semiconductor strain gauge is electrically connected with resistive elements, for example, through a wire formed by a P+-type high concentration region or an aluminum deposition so as to organize a full-bridge circuit.

A weight 16 is made of solder, covar, 42 alloy, Au or the like and is jointed onto the free edge of the cantilever 14.

A leading pin 17 passes through the base 12 and protrudes to the outside of the package. The clearance between the leading pin 17 and the through hole of the base 12 is filled with hard glass 18 thereby the leading pin 17 is fastened to the base 12 and electrically insulated.

Electrodes of the leading pin 17 and the detector 15 are wire bonded to each other by a wire 19 made of aluminum, gold or the like.

A securing pin 17' is used when the semiconductor acceleration sensor is installed on a printed-circuit board, for example.

Figure 1:
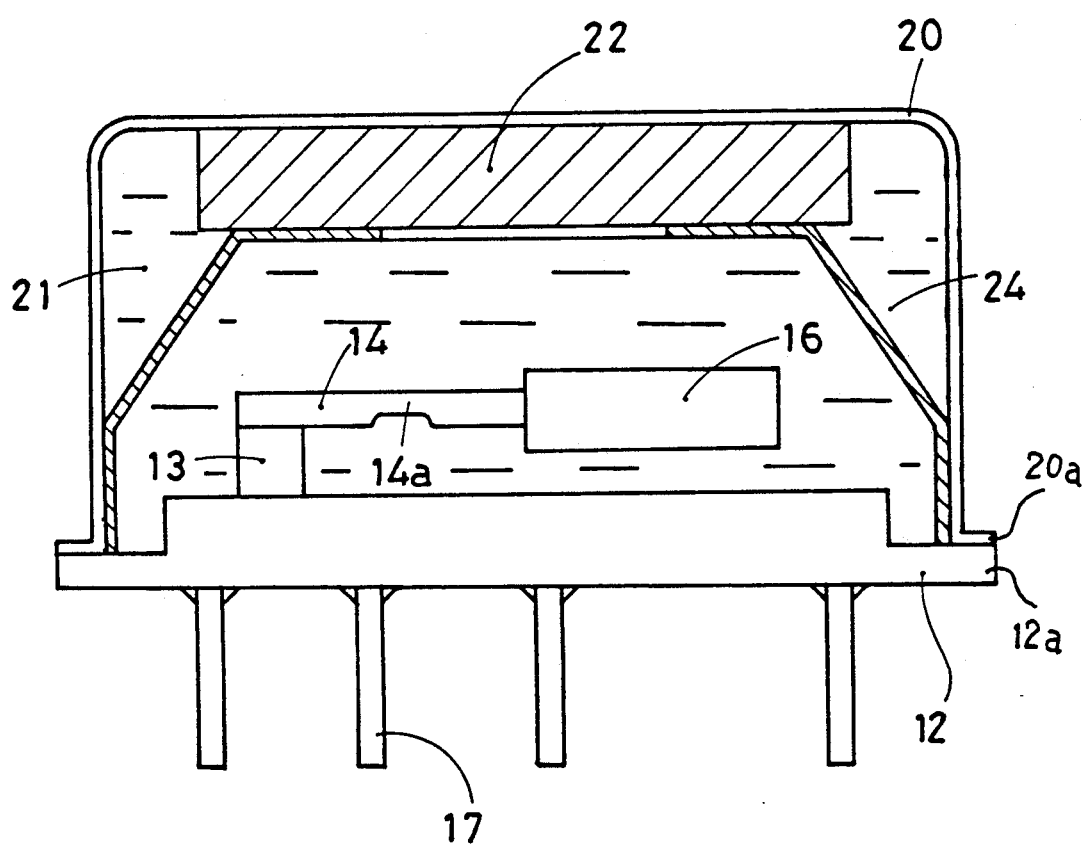
FIG. 1 is a cross-sectional view showing a semiconductor acceleration sensor which is took as an example of a liquid sealed semiconductor device according to a first preferred embodiment of the present invention.
Figure 2:
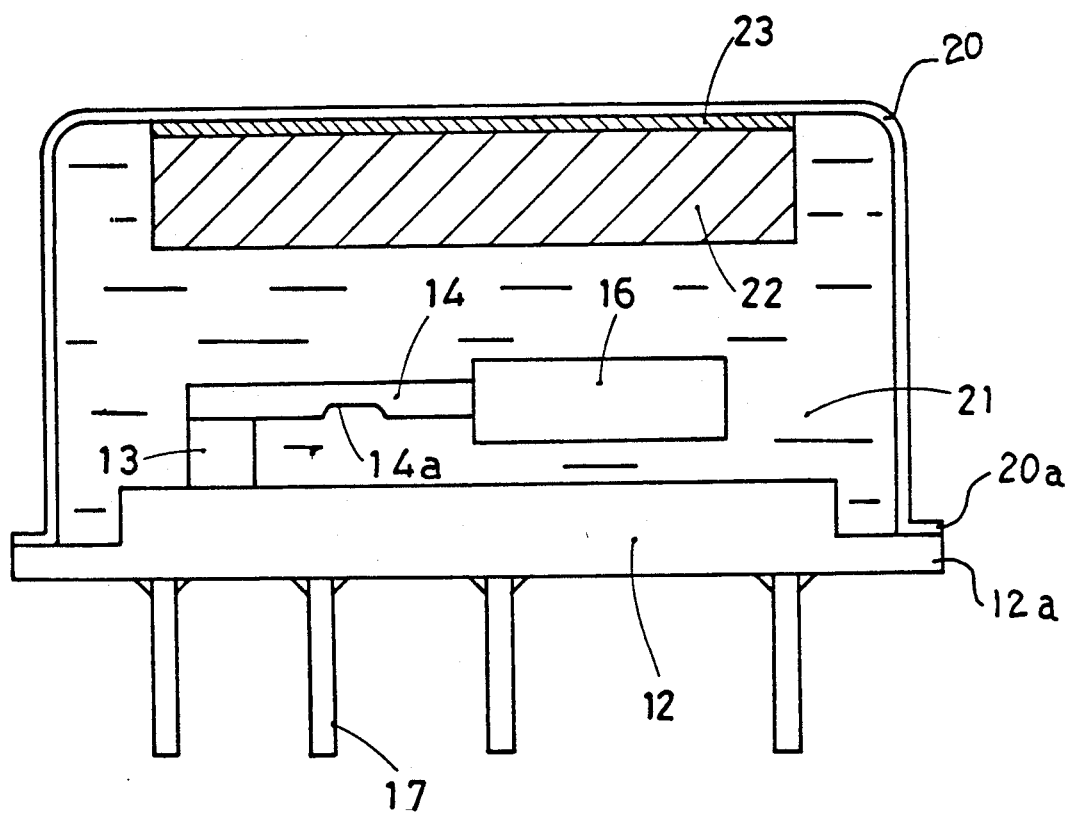
FIG. 2 is a vertical cross-sectional view showing the semiconductor acceleration sensor shown in FIG. 1 in which a sponge is fastened to a cap by an adhesive without using an internal cap.

FIGS. 1 and 2 are vertical cross-sectional views illustrating assembled semiconductor acceleration sensors. For the sake of a simplified description, the internal projecting part of the leading pin 17 as well as the wire 19 is left out of these figures.

Similar to the base 12, a cap 20 is made of a metal such as covar, 42 alloy, SPC or the like and has a welding part 20a at the peripheral portion. The welding part 20a is welded to the welding part 12a of the base 12 so that a highly hermetically sealed package is formed. The package is filled with damping liquid 21 such as silicon oil or the like. A highly foamed sponge 22 is made of silicon rubber, fluoro rubber, natural rubber or the like and is provided for absorbing the pressure change within the package which occurs when the damping liquid expands or contracts due to the change in the ambient temperature. This sponge 22 contains a number of closed cells. The closed cells expands and contracts so as to absorb the above-stated pressure change.

FIG. 2 shows an example of simple methods of fastening the sponge 22 to the inner wall of the package. In the example, the sponge 22 is adhered to the inner wall of the top face of the cap 20 through an adhesive 23. This method, however, has liable problems. The adhesive 23 has a danger of being eroded by the damping liquid 21 after the operation for a long period of time. In other case, an extraneous material may contaminate the adhesive 23 during the processing. In either case, the adhesive strength of the adhesive is deteriorated and the sponge 22 is liable to separate from the inner wall of the cap 20. If the sponge separates from the inner wall of the cap 20 and falls onto the weight 16, the cantilever 14 is no longer allowed to move free. As a result, it becomes impossible to detect the acceleration with the detector 15. There is another problem with this method. It is necessary to press the sponge 22 against the internal wall of the cap 20 with a strong pressure to securely fasten the former to the latter through the adhesive 23. Cells contained in the sponge 22 are squeezed out by pressing the sponge, which results in a deterioration of the characteristic effect of the sponge to absorb the pressure change of the damping liquid.

The inventor has improved the method of fastening the sponge to the inner wall of the package so as to suggest a construction shown in FIG. 1. An internal cap 24 is installed as a sponge fastening member to securely fasten the sponge 22 to the cap 20. The installment of the internal cap 24 eliminates the necessity of the adhesive 23. The adhesive 23, however, may be employed for temporarily fastening the sponge to the base thereby the assembling process can be smoothly carried out. In this case, it is not necessary to press the sponge 22 against the cap 20 with a strong pressure since the adhesive 23 is used only for a temporary attachment. Furthermore, any type of adhesives meet the requirement as long as it can provide some adhesive effect. It is further unnecessary to put the adhesive on the whole plane of the sponge which is to be abutted against the inner wall of the cap 20.

The internal cap 24 may be made of a metal as the base 12 and the cap 20 are, but the material is not limited to a metal. Any other materials that have some elasticity as well as a corrosion resistance to the damping liquid which is to be used can meet the requirement.

Figure 4:
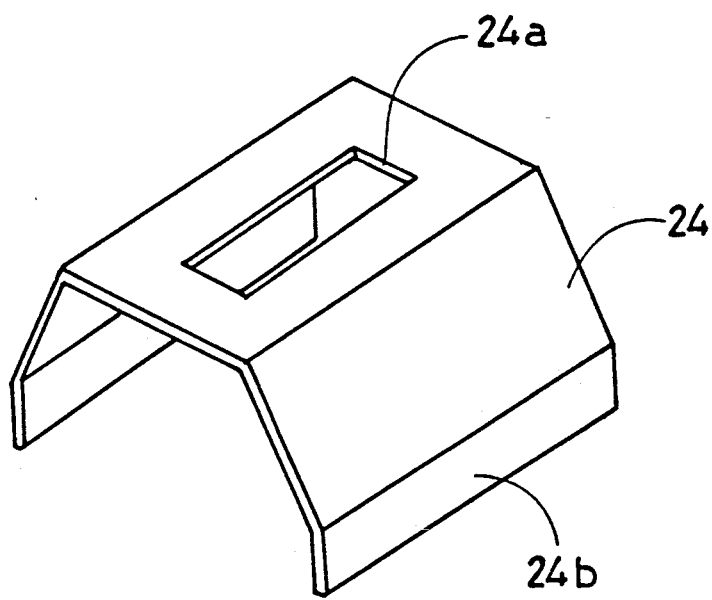
FIG. 4 is a diagonal view showing an internal cap of the semiconductor acceleration sensor shown in FIG. 1.

FIG. 4 is a diagonal view illustrating the internal cap 24.

A window 24a is provided to the top face of the internal cap 24. Therefore, the sponge 22 and the damping liquid 21 contact with each other by a large area so that the pressure change can be easily absorbed. The width between two side plates slightly widen at the lower portion so that it becomes wider than the width of the inner wall of the cap 20. When the internal cap 24 is inserted into the cap 20, fitting portions 24b of the side plates are pressed against the internal wall of the cap 20 and securely fastened thereto by means of the spring action.

Referring to FIGS. 5A through 5E, a process for filling the package with the damping liquid 21 will be described below.

As shown in FIG. 5A, the cap 20 is placed so that the opening thereof comes to the top. Then the sponge 22 is put in the cap 20. If an adhesive is provided to the sponge 22 at some portion of the lower surface for a temporary attachment, it is not necessary to ascertain whether or not the sponge 22 is in the correct position nor to adjust the position in the following step.

In the next step, the internal cap 24 is inserted down into the cap 20. The internal cap 24 is securely fitted to the internal wall of the cap 20 since the fitting parts 24b are pressed against the wall (FIG. 5B).

In the following step, the damping liquid is poured into the cap 20 (FIG. 5C). The base 12 to which the pedestal 13 and the cantilever 14 have been installed is inserted into the cap 20 which is filled with the damping liquid 21 (FIG. 5D). At this time, it is necessary to be avoided that bubbles enter the cap 20. When the base 12 is inserted into the cap 20, a certain amount of the damping liquid 21 which corresponds to the volume of the parts installed to the base 12 overflows out of the cap 20. The cap 20 is thus filled with the damping liquid 10 without containing any bubbles which should not exist therein (FIG. 5E). After a series of these processing steps are completed, the assembling process moves to the last step wherein the welding part 12a of the base 12 and the welding part 20a of the cap 20 are hermetically welded to each other by a spot welder, a parallel seam sealer welder or the like.

According to the above-stated assembling process, the sponge 22 is put into the cap 20 before the internal cap 24 is inserted therein. The sponge 22, however, may be previously adhered to the internal cap 24 through an adhesive or the like for a temporary attachment. In this case, the internal cap 24 and the sponge 22 are inserted into the cap 20 at the same time.

Figure 6A:
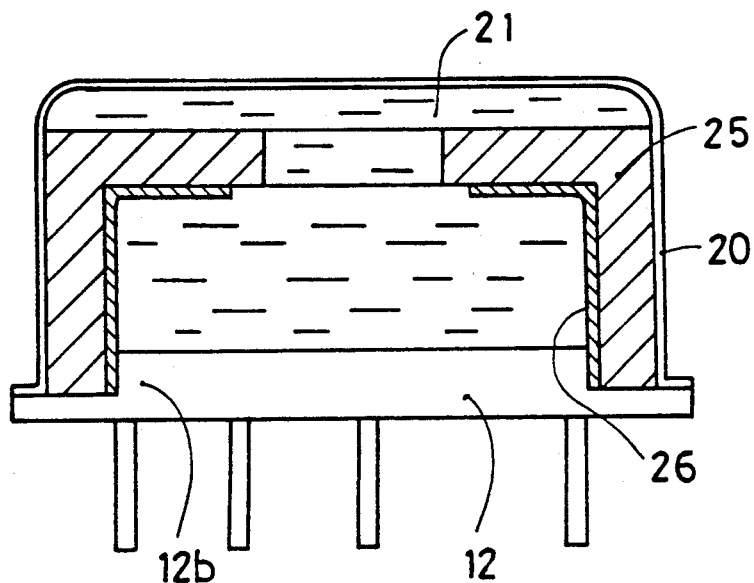
FIGS. 6A and 6B illustrate a second preferred embodiment of the semiconductor acceleration sensor in accordance with the present invention.
Figure 6B:
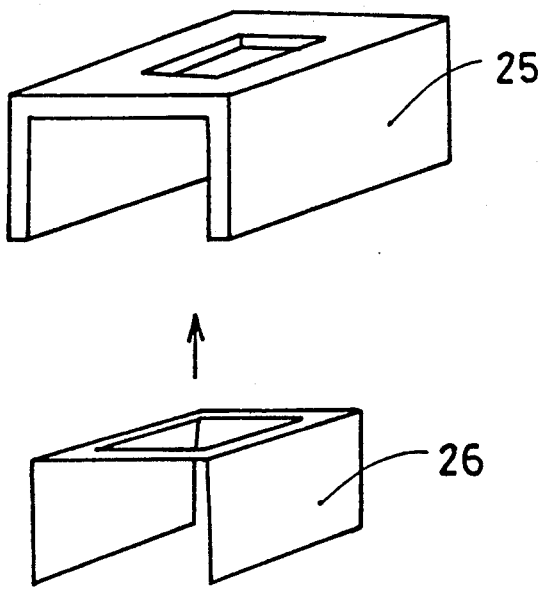

FIGS. 6A and 6B illustrate the second preferred embodiment of the semiconductor acceleration sensor in accordance with the present invention.

FIG. 6A is a vertical sectional view showing a semiconductor acceleration sensor in accordance with the second preferred embodiment of the present invention. For the sake of a simplified description, the components which are installed within the sensor such as a semiconductor element are eliminated from the figure.

According to the second preferred embodiment, a sponge 25 has an inverted U-shape and has an opening at the top face, while an internal cap 26 has a similar configuration to the sponge 25 and also has an opening at the top face, as shown in FIG. 6B. The sponge 25 is fastened to the cap 20 by the internal cap 26, as shown in FIG. 6A. Both side boards of the internal cap 26 are slightly directed towards the inside so that the projecting part 12b of the base 12 is clipped between lower ends of the side boards. The internal cap 26 is thus held to the base 12.

According to the second preferred embodiment, the sponge 25 is constructed to have a large volume. Furthermore, the top portion of the sponge 25 can be soaked into the damping liquid 21. Consequently, the damping liquid 21 and the damping liquid 21. Consequently, the damping liquid 21 and the sponge 25 contact to each other by a large area, which further improves the effect to absorb the pressure change. The semiconductor acceleration sensor in accordance with the present invention is very useful to be applied under the operating condition in which the temperature frequently changes.

Figure 7A:
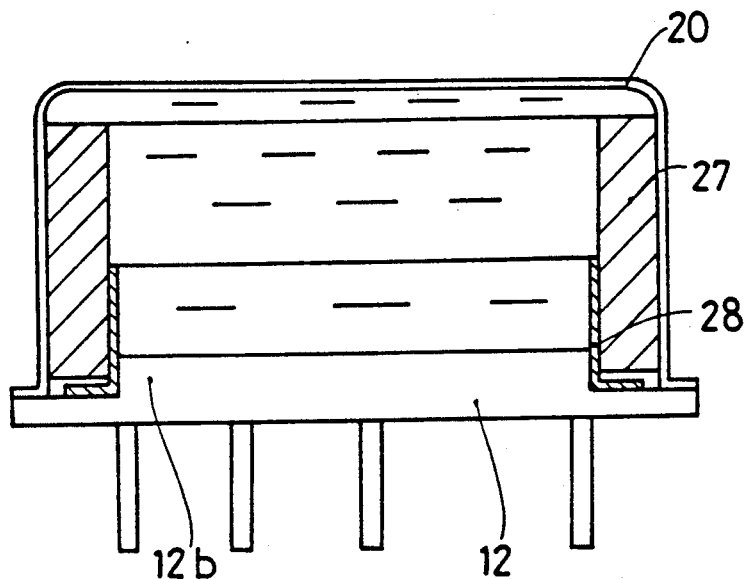
FIGS. 7A and 7B illustrate a third preferred embodiment of the semiconductor acceleration sensor in accordance with the present invention.
Figure 7B:
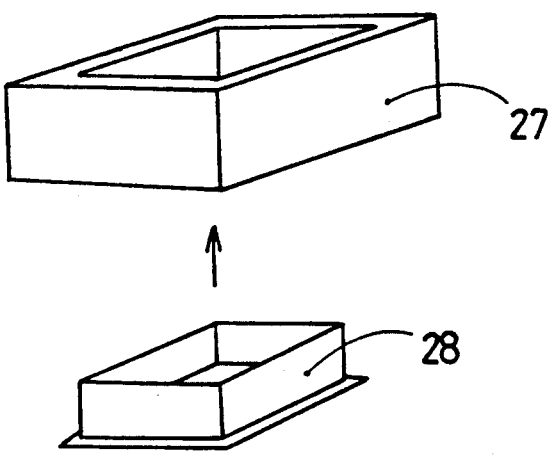
Figure 8:
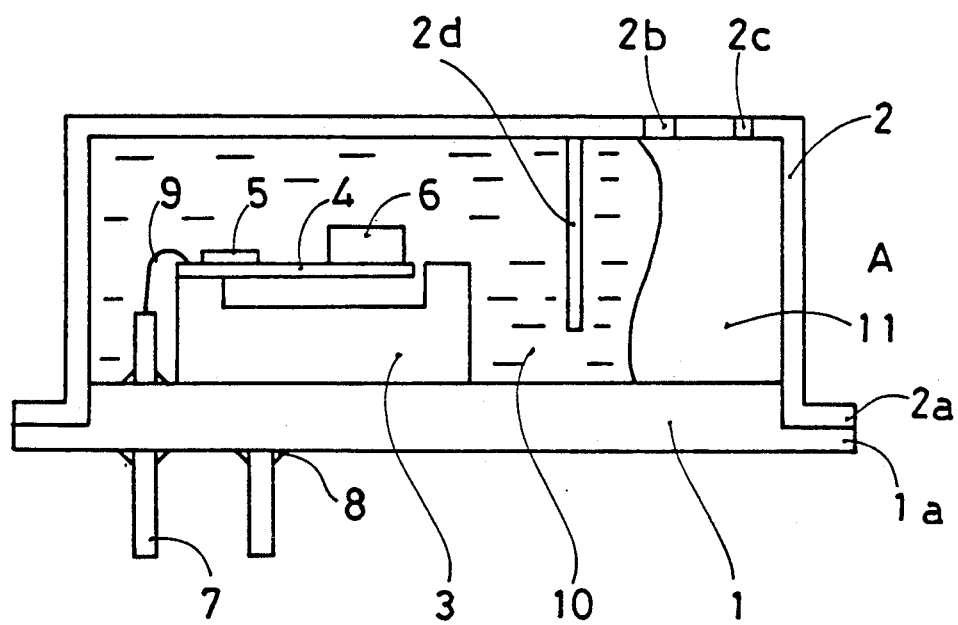
FIG. 8 is a vertical cross-sectional view showing a conventional semiconductor acceleration sensor.

FIGS. 7A and 7B illustrate the third preferred embodiment of the semiconductor acceleration sensor in accordance with the present invention.

FIG. 7A is a vertical sectional view showing a semiconductor acceleration sensor in accordance with the third preferred embodiment. Similar to FIG. 6, the components which are installed in the package such as the semiconductor element are eliminated from the figure, for the sake of a simplified description.

According to the third embodiment, a sponge 27 has a rectangular shape so as to cover four internal side walls of the cap 20. An internal cap 28 has a similar configuration to the sponge 27 but has a flare at the bottom, as shown in FIG. 7B). The sponge 27 is fastened to the cap 20 by the internal cap 28, as shown in FIG. 7A. The projecting part 12b of the base 12 fits to the lower portion of the inner wall of the internal cap 28 so that the internal cap 28 is fastened to the base 12.

According to the third preferred embodiment, the sponge 25 is constructed to have a large volume. Accordingly, the third preferred embodiment can provide the equivalent effect to that can be obtained by the second preferred embodiment shown in FIG. 6.

Respective configurations of the sponge and the internal cap for holding said sponge are not limited to those employed in the above preferred embodiments and can be appropriately modified in design to satisfy needs.

It is desirable that the internal cap is formed so as to fit to the base 12 or the cap 20, as is in the above preferred embodiments, but is not necessary. The internal cap may have any shape as long as it can hold the sponge without affecting the semiconductor sensing part.

In the process of assembling the semiconductor acceleration sensor, the temperature of the damping liquid may be previously raised up to the upper limit of the operating temperature range, whereby the welding parts of the cap and the base may be hermetically welded to each other.

A semiconductor acceleration sensor is took as an example of a semiconductor device in the above preferred embodiments. The present invention, however, can be applied to an apparatus in which a semiconductor element such as a signal detecting element, electric signal processing element, or the like as well as liquid such as damping liquid, insulating oil (electrical insulating oil or heat insulating oil), pressure transmitting and mediating liquid or the like are hermetically sealed within the package. Furthermore, a frequency band for the pressure to be transmitted can be defined according to the elastic modulus of the sponge which is to be inserted into a package as well as to the viscosity coefficient of the damping liquid filled in the package.

While the invention has been shown and described in detail, the foregoing description is in all aspects illustrative and not restrictive. It is therefore understood that numberous modifications and variations can be devised without departing from the scope of the invention.

What is claimed is:

1. A liquid sealed semiconductor device, comprising:
   a semiconductor element;
   a base to which said element is mounted;
   a cap jointed to said base to cover said semiconductor element;
   liquid for filling a package which is formed by joining said base and said cap;

a closed cell foam material provided in said package; and a fastening member for fastening said foam material to an inner wall of said package, wherein said fastening member comprises an internal cap disposed within said package, said internal cap pressing said foam material against an inner wall of said cap so that said foam material is held out of contact with the semiconductor element, wherein said semiconductor element comprises a pedestal which is adhered onto said base, a cantilever having a fixed edge which is fixed onto said pedestal and a free edge which is allowed to move free, a weight provided at said free edge of said cantilever, and a detector provided at a middle portion of said cantilever.

2. A liquid sealed semiconductor device in accordance with claim 1, further comprising;

a leading pin which passes through said base to protrude to the outside of said package and is connected with said semiconductor element through a wire.

3. A liquid sealed semiconductor device in accordance with claim 1, wherein;

said liquid includes damping liquid.

4. A liquid sealed semiconductor device in accordance with claim 3, wherein;

said damping liquid includes silicon oil.

5. A liquid sealed semiconductor device in accordance with claim 1, wherein;

said foam material includes a sponge which is made of any one of silicon rubber, fluoride rubber and natural rubber.

6. A liquid sealed semiconductor device in accordance with claim 1, wherein;

an edge portion of said fastening member is pressed against the inner wall of said cap so that said fastening member is fastened to said package.

7. A liquid sealed semiconductor device in accordance with claim 1, wherein;

said base comprises a projecting part which fits to an edge portion of said fastening member so that said fastening member is fastened to said package.

8. A liquid sealed semiconductor device in accordance with claim 1, wherein;

said foam material is held between said fastening member and said inner wall of said cap so as to be fastened to said cap.

9. A liquid sealed semiconductor device in accordance with claim 1, wherein;

said fastening member comprises an opening at a surface which abuttes against said foam material.

* * * * *